(12) United States Patent
Moon et al.

(10) Patent No.: US 11,242,984 B2
(45) Date of Patent: Feb. 8, 2022

(54) ELECTROLUMINANCE LIGHTING DEVICE HAVING HIGH APERTURE RATIO

(71) Applicant: LG Display Co., Ltd., Seoul (KR)

(72) Inventors: Youngkyun Moon, Paju-si (KR); JongMin Kim, Paju-si (KR); Seunghyun Youk, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 222 days.

(21) Appl. No.: 16/727,728

(22) Filed: Dec. 26, 2019

(65) Prior Publication Data

US 2020/0208821 A1    Jul. 2, 2020

(30) Foreign Application Priority Data

Dec. 28, 2018 (KR) .................. 10-2018-0172872

(51) Int. Cl.
  *H01L 27/32*     (2006.01)
  *F21V 23/00*     (2015.01)
  *H01L 51/52*     (2006.01)
  *F21Y 115/20*    (2016.01)
  *F21Y 115/15*    (2016.01)

(52) U.S. Cl.
  CPC ........ *F21V 23/002* (2013.01); *H01L 27/3283* (2013.01); *H01L 27/3288* (2013.01); *H01L 51/5209* (2013.01); *H01L 51/5253* (2013.01); *F21Y 2115/15* (2016.08); *F21Y 2115/20* (2016.08)

(58) Field of Classification Search
  CPC ............... F21V 23/002; H01L 27/3283; H01L 27/3288; H01L 51/5209; H01L 51/5253; H01L 27/3246; H01L 27/3248; H01L 27/3262; H01L 27/3279; H01L 27/3276; H01L 51/52; H01L 2251/5361; F21Y 2115/20; F21Y 2115/15
  See application file for complete search history.

(56) References Cited

U.S. PATENT DOCUMENTS

| | | | |
|---|---|---|---|
| 9,929,226 B2 * | 3/2018 | Im ....................... | H01L 51/5221 |
| 2005/0179374 A1 * | 8/2005 | Kwak .................. | H01L 51/5228 |
| | | | 313/506 |
| 2006/0158095 A1 * | 7/2006 | Imamura ............. | H01L 51/5212 |
| | | | 313/500 |
| 2015/0243711 A1 * | 8/2015 | Hong .................. | H01L 27/3253 |
| | | | 257/40 |

(Continued)

*Primary Examiner* — Bitew A Dinke
(74) *Attorney, Agent, or Firm* — Seed IP Law Group LLP (57) ABSTRACT

The present disclosure relates to an electroluminescent lighting device having high aperture ratio. The present disclosure provides an electroluminescent light device comprising: a substrate including an emission area and a non-emission area surrounding the emission area; a power line disposed in the emission area and defining an open area; a buffer layer covering the power line; an emission element disposed in the open area on the buffer layer; a link electrode overlapping the power line on the buffer layer, and having a first end connected to the emission element and a second end connected to the power line; a passivation layer deposited within a width of the power line covering the link electrode; an emission layer covering the emission area; and a cathode layer covering the emission area on the emission layer.

13 Claims, 5 Drawing Sheets

(56) References Cited

U.S. PATENT DOCUMENTS

| | | | |
|---|---|---|---|
| 2016/0079331 A1* | 3/2016 | Hwang | H01L 27/1222 |
| | | | 257/40 |
| 2016/0240598 A1* | 8/2016 | You | H01L 27/3276 |
| 2016/0293883 A1* | 10/2016 | Hong | H01L 27/3276 |
| 2017/0025066 A1* | 1/2017 | Pyon | H01L 27/3279 |
| 2017/0186831 A1* | 6/2017 | Nam | H01L 51/52 |
| 2017/0194415 A1* | 7/2017 | Choi | H01L 27/3279 |
| 2017/0365217 A1* | 12/2017 | An | G09G 3/3266 |
| 2018/0033979 A1* | 2/2018 | Jang | B32B 3/08 |
| 2018/0247988 A1* | 8/2018 | Lee | H01L 51/56 |

* cited by examiner

ELECTROLUMINANCE LIGHTING DEVICE HAVING HIGH APERTURE RATIO

CROSS-REFERENCE TO RELATED APPLICATIONS

This application claims the benefit of the Korean Patent Application No. 10-2018-0172872 filed on Dec. 28, 2018, which is hereby incorporated by reference as if fully set forth herein.

BACKGROUND

Technical Field

The present disclosure relates to an electroluminescent lighting device including an organic light emitting element having a certain aperture ratio.

Description of the Related Art

Recently, a series of researches has been actively conducted to use an organic light emitting element as a light source of the lighting device or a display device, based on many advantages and/or merits of an organic light emitting device. For example, a surface light source and/or a point light source applied with the organic light emitting element are applied to the lighting system for the vehicles such as an interior mood lamp, a head lamp, a fog lamp, a retracted lamp, a car light, a number light, a tail lamp, a brake light, a turn signal lamp and so on.

When an organic light emitting element is applied to the lighting device, it is beneficial to have a robust structure against the foreign materials such as moisture and oxygen which can penetrate from the outside according to its applied environment. In addition, due to the loss of light amount occurred in the organic light emitting element itself, the luminescent efficiency may be degraded.

BRIEF SUMMARY

An organic light emitting device according to the present disclosure protects the light emitting element from external environments (e.g., moisture, oxygen, or the like) and improves the luminescence efficiency and achieves high aperture ratio. The present disclosure also provides a high aperture electroluminescent lighting device having an enhanced stability and an elongated lifetime.

One embodiment of the present disclosure provides an electroluminescent light device including: a substrate including an emission area and a non-emission area surrounding the emission area; a power line disposed in the emission area and defining an open area; a buffer layer covering the power line; an emission element disposed in the open area on the buffer layer; a link electrode overlapping the power line on the buffer layer, and having a first end connected to the emission element and a second end connected to the power line; a passivation layer deposited within a width of the power line covering the link electrode; an emission layer covering the emission area; and a cathode layer covering the emission area on the emission layer.

In one embodiment, the power line has a mesh shape surrounding the open area; and the open area has a polygon shape and is separated from neighboring open area with a predetermined distance corresponding to the width of the power line.

In one embodiment, the emission element includes: a first electrode larger than the open area; the emission layer deposited on the first electrode; and a second electrode defined by the open area among areas of the cathode layer.

In one embodiment, the link electrode has a segment shape overlapping a middle portion of the power line; the first end is extended from the first electrode; and the second end is connected to the power line through a pixel contact hole penetrating the buffer layer.

In one embodiment, the passivation layer covers whole of the link electrode and the pixel contact hole under the emission layer, and covers a circumference of the first electrode.

In one embodiment, the passivation layer has a boundary disposed between the circumference of the first electrode and a circumference of the open area, and exposes the open area.

In one embodiment, the electroluminescent lighting device further comprises: a routing line connected to the power line, and disposed at the non-emission area as surrounding the emission area; a first pad disposed at one side of the non-emission area and connected to the routing line; and a second pad disposed at another side of the non-emission area and as being separated from the routing line, and having an end connected to the cathode layer.

In one embodiment, the cathode layer is formed on the buffer layer covering the end of the second pad, and connected to the second pad through a pad contact hole exposing the end of the second pad.

In one embodiment, the electroluminescent lighting device further comprises: an encapsulation layer covering the emission area having the emission element; a cover film disposed on the encapsulation layer; and an adhesive attaching the encapsulation to the cover film.

The electroluminescent lighting device according to the present disclosure has a new structure in which the power line is overlapped with the anode electrode not to be directly contacted but to be stacked with an insulation buffer layer there-between. In addition, as the short-circuit protection structure formed by patterning the anode layer is disposed as overlapping with the auxiliary power line, the aperture ration can be increased or maximized. Further, with the structure in which there is no anode layer at the pad area, the structure of the lighting device according to the present disclosure is suitable for flexible lighting device and to enhance the stability of elements.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case that "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," and "next," the case of no contact there-between may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

Figure 1:
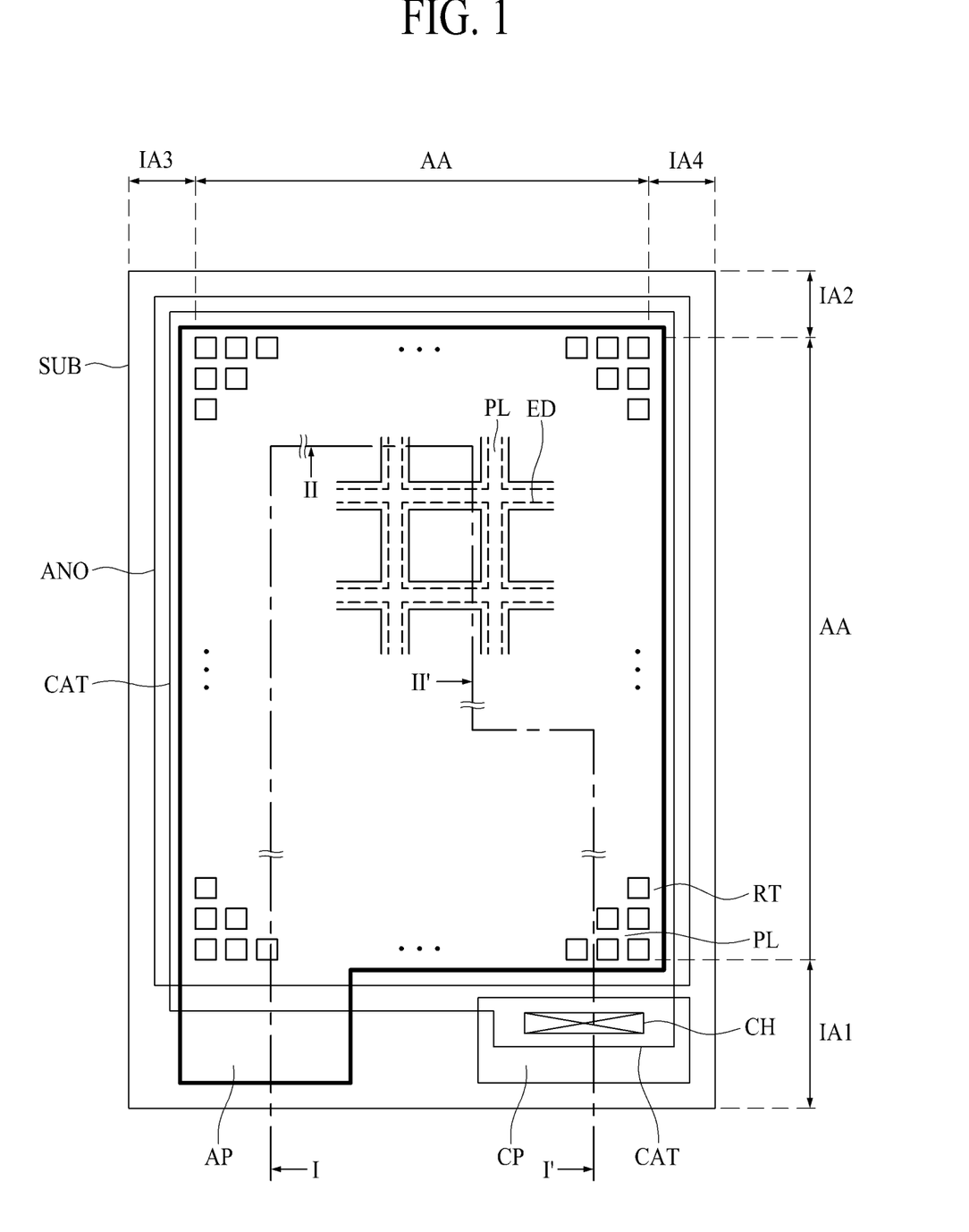
FIG. 1 is a plan view illustrating an electroluminescent lighting device according to one embodiment of the present disclosure.
Figure 2:
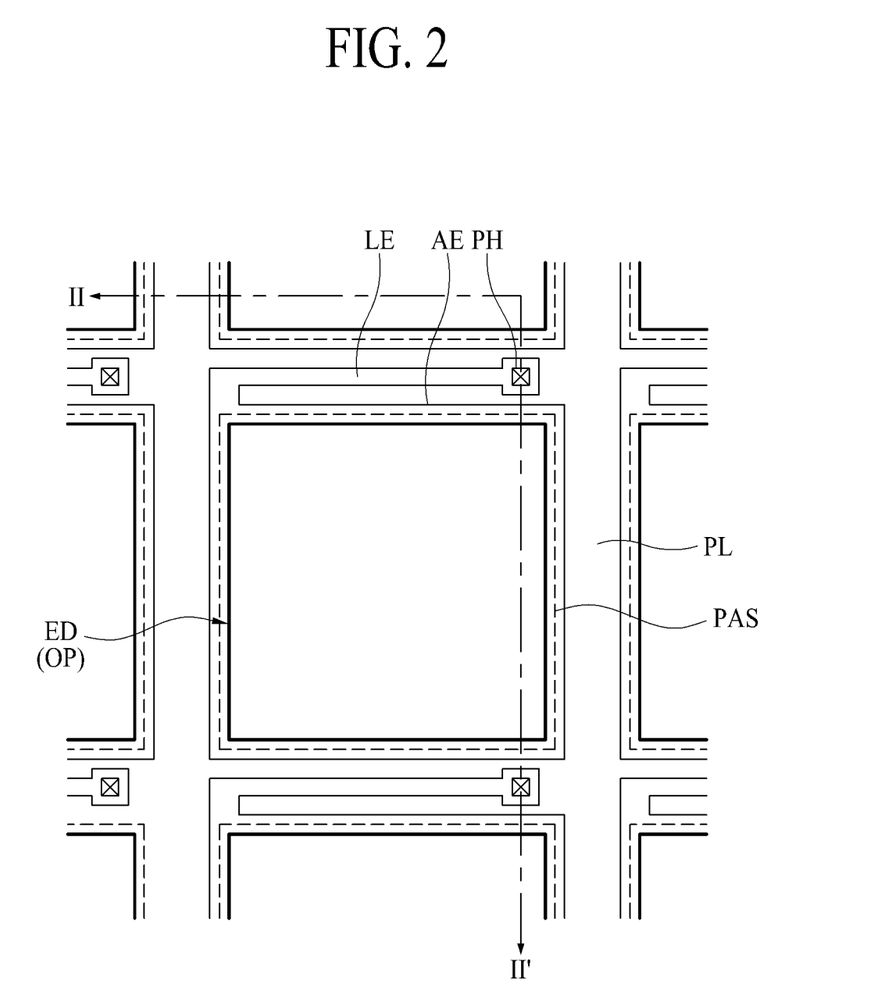
FIG. 2 is an enlarged plan view illustrating one example of the pixels arrayed in the emission area of the electroluminescent lighting device according to one embodiment of the present disclosure.

Hereinafter, referring to FIGS. 1 and 2, an electroluminescent lighting device according to the first embodiment of the present disclosure will be explained. FIG. 1 is a plan view illustrating an electroluminescent lighting device according to one embodiment of the present disclosure. FIG. 2 is a cross-sectional view, taken along the cutting line I-I' of FIG. 1, illustrating a structure of the electroluminescent lighting device according to one embodiment of the present disclosure. In this embodiment, the lighting device is an organic luminance lighting device, but it is not limited thereto.

Referring to FIG. 1, an electroluminescent lighting device according to the present disclosure comprises a substrate SUB, a routing line RT, a power line PL, an anode layer ANO, a cathode layer CAT, an emission element, a first pad and a second pad.

The substrate SUB, as a based substrate (or a base layer), includes a plastic material or a glass material. The lighting device may have various shapes and the properties suitable for the functional purposes. Therefore, it is preferable that the substrate SUB has the characteristics suitable for its function and purpose. For example, the substrate SUB may be formed of an opaque material to provide the lights in only one direction of the substrate SUB, or may be formed of a transparent material to provide the lights in both directions of the substrate SUB. In one example, for the case of the bottom emission type or bi-directional emission type, the substrate SUB is made of a transparent material.

In one example, the substrate SUB, in a plan view, may have a rectangular shape, a rounded rectangular shape in which each corner is rounded with a certain radius of curvature, a non-square shape having at least five sides, a circular shape or an elliptical shape. However, other shapes and sizes can be used according to specific designs or needs and is not limited to the aforementioned shapes.

The substrate SUB may include an emission area AA and a non-emission area IA. The emission area AA is disposed in the most middle portions of the substrate SUB which can be defined as an area for emitting the lights. In one example, the emission area AA may have, in a plan view, a rectangular shape, a rounded rectangular shape and non-rectangular shape having at least five sides.

The non-emission area IA is provided in the circumferential area of the substrate SUB to surround the emission area AA, which may be defined as an area in which light is not provided therefrom. In one example, the non-emission area IA may include a first non-emission area IA1 disposed at the first side of the substrate SUB, a second non-emission area IA2 disposed at the second side parallel to the first non-emission area IA1, a third non-emission area IA3 disposed at the third side perpendicular to the first non-emission area IA1, and a fourth non-emission area IA4 disposed at the fourth side parallel to the third non-emission area IA3. In detail, the first non-emission area IA1 may be set on the upper side (or lower side) of the substrate SUB, the second non-emission area IA2 may be set on the lower side (or upper side) of the substrate SUB, the third non-emission area IA3 may be set on the left side (or right side) of the substrate SUB, and the fourth non-emission area IA4 may be set on the right side (or left side) of the substrate SUB. But it is not restricted thereto.

The routing line RT may be arranged as surrounding the edge/circumference of the substrate SUB. The routing line RT is disposed at the non-emission area IA and may have a closed curve shape surrounding the emission area AA, for example, a rectangular band shape. The routing line RT is an electric wiring line for supplying the electric power to the emission area AA. For example, the routing line RT may be a line for supplying the (+) power voltage.

The power line PL is disposed in the emission area AA as having a grid pattern or a strip pattern. FIG. 1 shows the case in which the power line PL is formed as including a plurality of meshes having an open area, but it is not restricted thereto. The power lines PL may be the branched/extended lines from the routing line RT disposed in the non-emission area IA to the emission area AA and distributed uniformly over the whole surface of the substrate SUB. The open area defined by the mesh/grid shape/pattern of the power line PL is defined as the single/unit emission area for providing the light. Therefore, the shape or pattern of the power line PL may define the shape of the unit emission area.

The anode layer ANO is stacked on the substrate SUB as covering the emission area AA. Especially, the anode layer ANO may cover the routing line RT and the power line PL on a buffer layer (not shown) therebetween. For example, the anode layer ANO may be deposited on the substrate SUB as having a surface area the same as or larger that of the emission area AA.

The cathode layer CAT is stacked on the substrate SUB as covering the emission area AA. The cathode layer CAT may be disposed on the emission area AA as well on some portions of the non-emission area IA. The cathode layer CAT may be formed as having substantially the same surface area as the emission area AA or slightly larger area than the emission area AA.

The emission element ED may be formed at the unit emission area defined by the power line PL. The emission element ED may include a first electrode AE, an emission layer (not shown in FIG. 1) and a second electrode (not shown in FIG. 1). The first electrode may be a conductive layer formed as corresponding to the unit emission area. For example, the first electrode may be made of a transparent conductive material such as the indium tin oxide (ITO) or indium zinc oxide (IZO). The emission layer is deposited on the first electrode AE. The second electrode is deposited on the emission layer. The second electrode may be some portions of the cathode layer CAT corresponding to the unit emission area, wherein the cathode layer CAT is formed over the whole area of the emission area AA.

The first pad AP may be disposed at a portion of the non-emission area IA. For example, the first pad AP may be disposed at one side of the first non-emission area IA1. The first pad AP may be made as being one body with the routing line RT. For example, in one embodiment, the first pad AP and the routing line RT is a single, continuous body. The first pad AP may be an electric terminal pad for supplying the driving electric power to the routing line RT and the power line PL.

The second pad CP may be formed at other portion of the non-emission area IA. For example, the second pad CP may be disposed at the opposite side to the first non-emission area IA1 having the first pad AP. The second pad CP may be formed as an island shape physically and electrically isolated from the routing line RT. The second pad CP may be formed of the same material and at the same layer as the routing line RT, the power line PL and the first pad AP. However, in one embodiment, the second pad CP is separated from the routing line RT. The second pad CP may be an electrical pad terminal for supplying the common voltage to the cathode layer CAT. For example, the cathode layer CAT may be physically connected to the second pad CP through a pad contact hole CH formed at the buffer layer (not shown) covering some portions of the second pad CP.

Hereinafter, referring to FIG. 2, the structure of the emission element ED disposed at the emission area AA is explained. FIG. 2 is an enlarged plan view illustrating one example of the pixels arrayed in the emission area of the electroluminescent lighting device according to one embodiment of the present disclosure.

At first, with FIG. 2, we will explain about the plan structure of the emission element ED. Referring to FIG. 2, the emission element ED may include a first electrode AE and a link electrode LE. The first electrode AE and the link electrode LE may be formed by depositing and patterning a transparent conductive material on the substrate SUB. That is, the first electrode AE and the link electrode LE may be configured to be one body. The first electrode AE and the link electrode LE may be formed as overlapping with the power line PL on the buffer layer (not shown) covering whole surface of the emission area AA.

The first electrode AE may have a size larger than the open area OP as covering whole of the open area OP defined by the power line PL. For example, when the open area OP has a rectangular shape, the first electrode AE may have the rectangular shape corresponding to the open area OP and have a slightly larger size than the open area OP.

The link electrode LE may be formed as overlapping with the power line PL. For example, the link electrode LE may have a segment shape overlapping with the middle portion of the power line PL located one side of the open area OP. The first end of the link electrode LE may be connected to the first electrode AE. The second end of the link electrode LE may be connected to the power line PL. In one example, the second end of the link electrode LE may be connected to the power line PL through the pixel contact hole PH formed at the buffer layer (not shown) covering the power line PL. The pixel contact hole PH and the link electrode LE may be disposed within the area of the power line PL.

The link electrode LE may be a connector having segment shape and connecting the first electrode AE and the power line PL. The link electrode LE may be a pathway for supplying the power voltage to the first electrode AE from the power line PL. Because the link electrode LE is a thin line, it has resistance. That is, when the short-circuit problem occurs at the first electrode AE of any unit pixel P, the link electrode LE may control the excessive amount of electric current due to its resistance. When the electric currents are focused on the pixel having the short-circuit problem, the link electrode LE may function as a fuse, and accordingly can prevent the short-circuit problem affecting the neighboring pixels.

The link electrode LE and the pixel contact hole PH may be covered by a passivation layer PAS. The dotted line shown in FIG. 2 means the boundary of the passivation layer PAS. The passivation layer PAS may have an aperture having a larger area than the open area OP defined by the power line PL. However, the aperture of the passivation layer PAS has a smaller area than the first electrode AE.

The emission layer (not shown) is disposed on the substrate SUB having the first electrode AE and the link electrode LE as covering the whole of the emission area AA. On the emission layer, the cathode layer CAT is deposited as covering the whole of the emission area AA. The portions of the cathode layer CAT corresponding to the open area OP defined by the power line PL is defined as the second electrode (not shown). As the result, the open area OP defined by the power line PL has the emission element ED including the first electrode AE, the emission layer and the second electrode.

The driving voltage may be supplied via the first pad AP. The power voltage is supplied to the power line PL through the routing line RT extended from the first pad AP. The driving voltage supplied from the power line PL is applied to the link electrode LE through the pixel contact hole PH. Finally, the driving voltage is supplied to the first electrode AE from the link electrode LE.

Some portions of the second pad CP neighboring to the emission area AA is covered by the buffer layer. The second pad CP may be connected to the cathode layer CAT via the pad contact hole CH formed at the buffer layer covering the second pad CP. The common voltage may be supplied to the second pad CP. The common voltage is supplied to the cathode layer CAT connected to the second pad CP and then applied to the second electrode, one parts of the cathode layer CAT.

Figure 3:
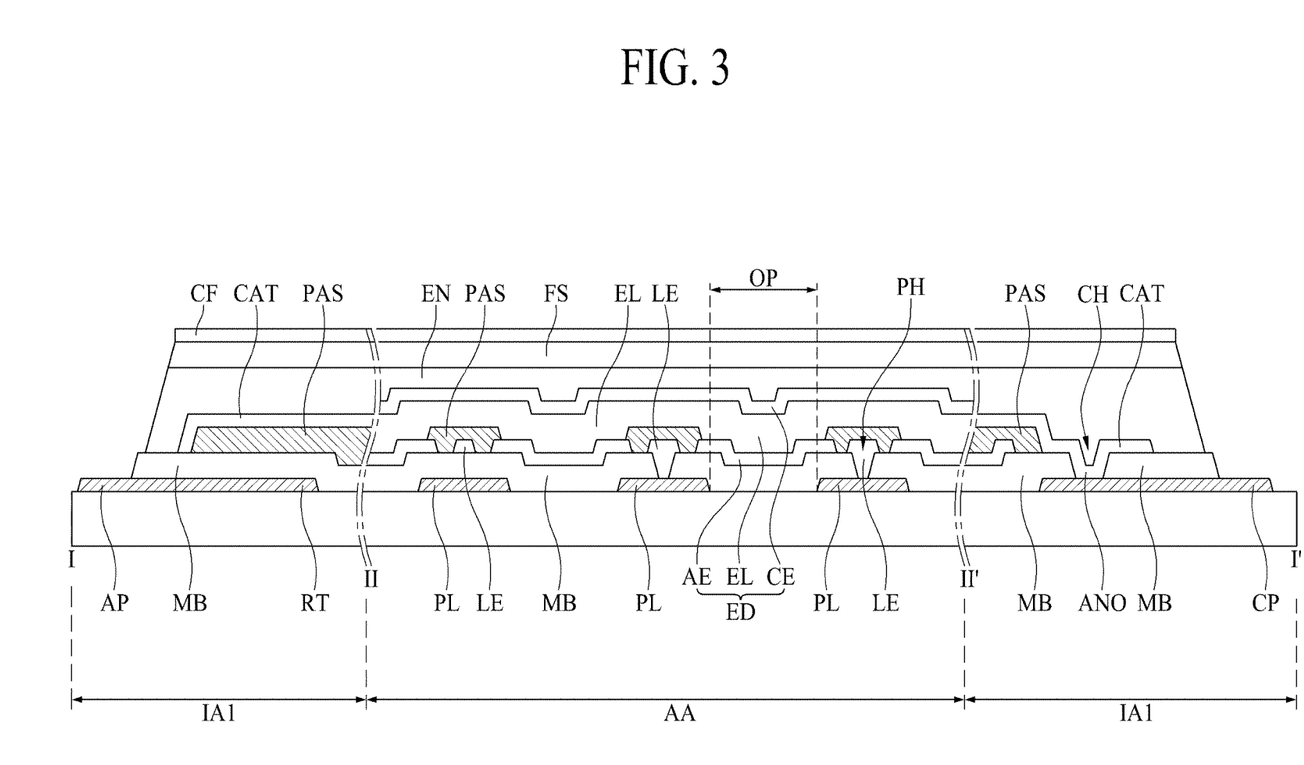
FIG. 3 is a cross-sectional view, taken along the cutting line I-I' of FIG. 1 and the cutting line II-II' of FIG. 2, illustrating a structure of the electroluminescent lighting device according to one embodiment of the present disclosure.

Hereinafter, referring to FIG. 3, the cross-sectional structure of the electroluminescent lighting device according to the present disclosure will be explained. As the cross-sectional view may show the parts not shown in the plan view, with the FIGS. 1 and 2, the complete structure of the lighting device may be easily understood. FIG. 3 is a cross-sectional view, taken along the cutting line I-I' of FIG. 1 and the cutting line II-II' of FIG. 2, illustrating a structure of the electroluminescent lighting device according to one embodiment of the present disclosure. The cross-sectional view taken along the cutting line II-II' shows some part of the unit emission area taken along the cutting line I-I'.

Referring to FIG. 3, the electroluminescent lighting device according to the present disclosure comprises a substrate SUB, a first pad AP, a routing line RT, a power line PL, a second pad CP, a buffer layer MB, a first electrode AE, a passivation layer PAS, an emission layer EL, a cathode layer CAT, an encapsulation layer EN, an adhesive (or face seal) FS and a cover film CF.

The substrate SUB may include an emission area AA and a non-emission area IA surrounding the emission area AA. The substrate SUB, as a based substrate (or a base layer), includes a plastic material or a glass material. For example, the substrate SUB may include an opaque or a colored polyimide material. The substrate SUB may include a flexible substrate or a rigid substrate. For example, the flexible substrate SUB may be made of glass material. The flexible substrate SUB may be a thinned glass substrate having a thickness of about 100 micrometer or less, or may be etched glass substrate to have a thickness of about 100 micrometer or less.

On the upper surface of the substrate SUB, the first pad AP, the routing line RT, the power line PL and the second pad CP are formed of a metal material. The first pad AP, the routing line RT and the power line PL are made in one body connected each other. The second pad CP may be patterned as being separated from the first pad AP, the routing line RT and the power line PL.

The routing line RT may be formed at the non-emission area IA as surrounding the circumference of the emission area AA. The power line PL is connected to the routing line RT and has the grid or the mesh shapes having a plurality of the open areas OP arrayed in the matrix manner within the emission area AA. The first pad AP and the second pad CP may be disposed at one side and the other side separated each other with a predetermined distance within the first non-emission area IA1. The predetermined distance may be selected based on the various applicable designs of the display.

The buffer layer MB may be deposited on the upper surface of the substrate SUB having the first pad AP, the routing line RT, the power line PL and the second pad CP. In one example, the buffer layer MB may include a plurality of inorganic layers which are alternatively stacked each other. For example, the buffer layer MB may be formed as a multi-layered structure in which at least one inorganic layer of silicon oxide (SiOx), silicon nitride (SiNx) or silicon oxynitride (SiON) are alternately stacked. In another example, the buffer layer MB may be formed as stacking at least two of an organic layer and an inorganic layer.

On the buffer layer MB, by depositing and patterning a conductive material, the link electrode LE and the first electrode AE are formed. Here, the conductive material may include a transparent conductive material or a semi-transparent conductive material which can pass the lights. In one example, the transparent conductive material may include indium tin oxide or indium zinc oxide. In other examples, the semi-transparent conductive material may further include magnesium (Mg), silver (Ag) or alloy of magnesium (Mg) and silver (Ag).

One end of the link electrode LE may be connected to the power line PL through the pixel contact hole PH. The first electrode AE may have a slightly larger size than the open area OP defined between the power lines PL. The first electrode AE may be connected to the other end of the link electrode LE.

The passivation layer PAS is deposited on the link electrode LE. The passivation layer PAS may be formed as having a width wider than the link electrode LE and narrower than the power line PL. In one embodiment, it is preferable that the passivation layer PAS covers the circumference area of the first electrode AE, but not exceed the width of the power line PL. However, in other embodiments, other configurations may be employed.

The emission layer EL may be deposited on the passivation layer PAS and the first electrode AE. In one embodiment, the emission layer EL is formed to have one body of thin layer covering the whole surface of the emission area AA. For an example, the emission layer EL may include at least two emission portions vertically stacked for radiating white color lights. For another example, the emission layer EL may include a first emission portion and a second emission portion for radiating a white light by mixing a first color light and a second color light. Here, the first emission portion may include any one of a blue emission portion, a green emission portion, a red emission portion, a yellow emission portion, and a yellow-green emission portion to emit the first color light. In the interim, the second emission portion may include any one among a blue emission portion, a green emission portion, a red emission portion, a yellow emission portion, and a yellow-green emission portion, to emit the second color light having a complementary relation to the first light.

The cathode layer CAT is deposited on the emission layer EL. The cathode layer CAT may cover the whole surface of the emission area AA. For example, the cathode layer CAT may have a slightly larger area than the emission layer EL. In addition, some of the cathode layer CAT may expand to the second pad CP to connect the second pad CP through the pad contact hole CH exposing one portions of the second pad CP.

The cathode layer CAT may be made of a metal material having superior reflectiveness property. For example, the cathode layer CAT may include a multiple layered structure such as a stacked structure of aluminum and titanium (i.e., Ti/Al/Ti), a stacked structure of aluminum and ITO (indium tin oxide) (i.e., ITO/Al/ITO), an APC alloy (Ag/Pd/Cu), and a stacked structure of APC alloy and ITO (i.e., ITO/APC/ITO). Otherwise, the cathode layer CAT may include a single layered structure having any one material or alloy material of two or more among silver (Ag), aluminum (Al), molybdenum (Mo), gold (au), magnesium (Mg), calcium (Ca) or barium (Ba).

Among the cathode layer CAT, some area overlapping the first electrode AE, e.g., overlapping the open area OP defined by the power line PL, may be defined as the second electrode CE. Therefore, the first electrode AE, the emission layer EL and the second electrode CE stacked sequentially and contacted each other in face within the open area OP are formed the emission element (or emission diode) ED.

The encapsulation layer EN may be deposited on the substrate SUB having the emission element ED. The encapsulation layer EN may include a single layered material, or a multiple layered material. In one example, the encapsulation layer EN may include a first inorganic layer, an organic layer on the first inorganic layer, and a second inorganic layer on the organic layer. The inorganic layers are for preventing the foreign materials such as moisture and oxygen from intruding into the emission element ED. In one example, the inorganic layers may include at least any one of silicon nitride, aluminum nitride, zirconium nitride, titanium nitride, hafnium nitride, tantalum nitride, silicon oxide, aluminum oxide, titanium oxide and so on. The inorganic layers may be formed by the chemical vapor deposition method or the atomic layer deposition method.

In one example, the organic layer may be formed of the organic resin material such as silicon oxycarbide (SiOC), acryl or epoxy. The organic layer may be formed by the coating method such as the inkjet method or the slit coating method.

The encapsulation layer EN may cover all emission area AA, and some of the non-emission area IA. However, in one embodiment, it is preferable that the encapsulation layer EN does not cover the first pad AP and the second pad CP to expose them.

On the encapsulation layer EN, a cover film CF may be disposed or attached. The cover film CF may be a thick film including metal material. In order to attach the cover film CF to the encapsulation layer EN, an adhesive FS may be used. In one embodiment, the cover film CF exposes the first pad AP and the second pad CP.

Figure 4:
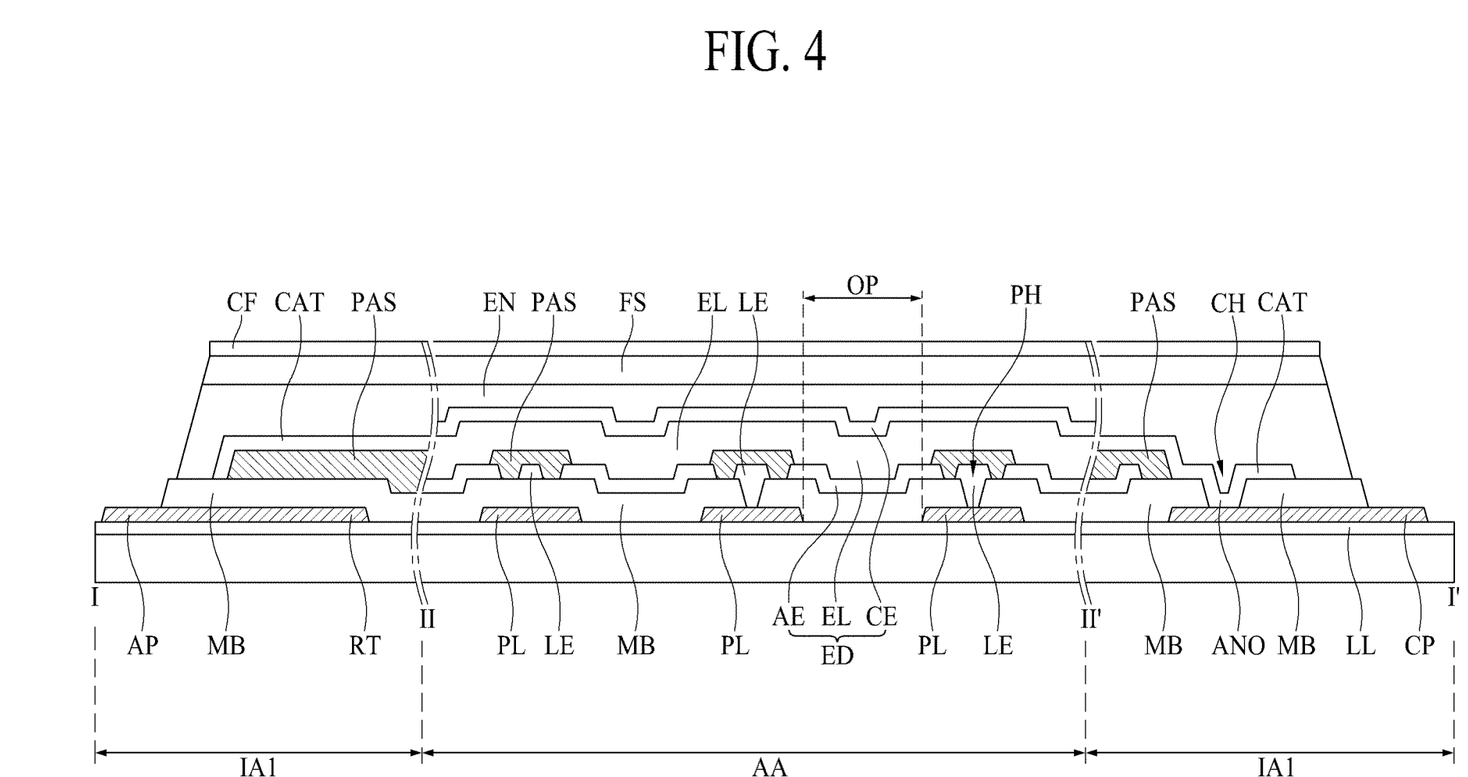
FIG. 4 is a cross-sectional view, taken along the cutting line I-I' of FIG. 1 and the cutting line II-II' of FIG. 2, illustrating a structure of the electroluminescent lighting device according to another embodiment of the present disclosure.

Hereinafter, referring to FIG. 4, another embodiment of the present disclosure will be explained. FIG. 4 is a cross-sectional view, taken along the cutting line I-I' of FIG. 1 and the cutting line II-IP of FIG. 2, illustrating a structure of the electroluminescent lighting device according to another embodiment of the present disclosure.

The basic structure of the electroluminescent lighting device according to another embodiment of the present disclosure is substantially the same as or very similar with that of the one embodiment above explained. The differences may be that some additional layers are further included in the cross-sectional view.

Referring to FIG. 4, the electroluminescent lighting device according to another embodiment may comprises a substrate SUB, a light extracting layer LL, a first pad AP, a routing line RT, a power line PL, a second pad CP, a buffer layer MB, a first electrode AE, a passivation layer PAS, an emission layer EL, a cathode layer CAT, an encapsulation layer EN, an adhesive FS and a cover film CF. Compared with FIG. 3, FIG. 4 shows that the light extracting layer LL is further included between the substrate SUB and the routing line RT.

The substrate SUB may include an emission area AA and a non-emission area AA surrounding the emission area AA. On the whole surface of the substrate SUB, the light extracting layer LL is deposited.

The light extracting layer LL may include an organic material having high resistance and a plurality of light scattering particles dispersed in the organic material. In addition, the light extracting layer LL may further include a plurality of particles having high refractive index to radiate the light from the emission layer EL to outside effectively. When the lights generated from the emission layer EL may reflected by the cathode layer CAT and radiated to the bottom side, the light efficiency may be enhanced by the light extracting layer LL. Other elements are the same as the embodiment above mentioned so that duplicated explanation may be omitted.

Figure 5:
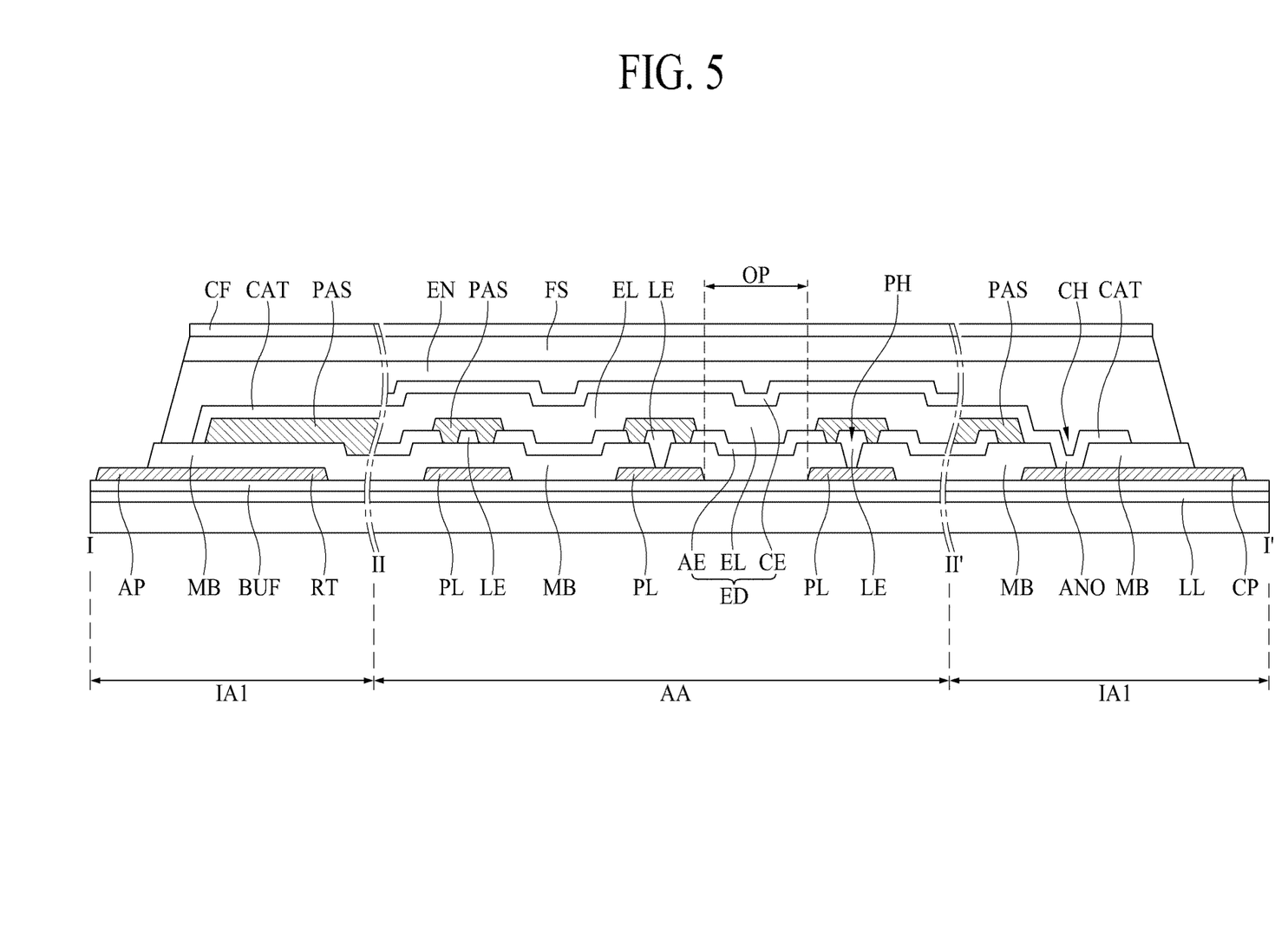
FIG. 5 is a cross-sectional view, taken along the cutting line I-I' of FIG. 1 and the cutting line II-II' of FIG. 2, illustrating a structure of the electroluminescent lighting device according to still another embodiment of the present disclosure.

Hereinafter, referring to FIG. 5, further embodiments of the present disclosure will be explained. FIG. 5 is a cross-sectional view, taken along the cutting line I-I' of FIG. 1 and the cutting line II-II' of FIG. 2, illustrating a structure of the electroluminescent lighting device according to further embodiments of the present disclosure.

In this embodiment of the present disclosure, as shown in FIG. 5, the light extracting layer LL is deposited on the substrate SUB, and the first pad AP, the routing line RT, the power line PL and the second pad CP made of the metal material are formed. In one embodiment, the first pad AP, the routing line RT, the power line PL and the second pad CP may include a low resistance material such as copper (Cu).

The material such as copper has relatively low resistance, so that it is very suitable to apply for the power line PL and the routing line RT. However, when the copper is directly deposited on the light extracting layer LL, the copper layer may be oxidized and then deteriorated its properties. This may be because since the thermal treatment processing is required and the light extracting layer LL includes the organic material, there is a high possibility that copper material will easily come into contact with oxygen thereafter.

In addition, copper has poor interfacial adhesion with the organic materials so that it can be easily peeled off. In order to prevent these problems, in one embodiment, a lower buffer layer BUF is further deposited on the light extracting layer LL.

The lower buffer layer BUF may include the same material as the buffer layer MB covering the first pad AP, the routing line RT, the power line PL and the second pad CP. In one embodiment, the lower buffer layer BUF is deposited on the whole surface of the light extracting layer LL.

The first pad AP, the routing line RT, the power line PL and the second pad CP are formed on the lower buffer layer BUF. In one embodiment, the first pad AP, the routing line RT, the power line PL and the second pad CP are formed of the same metal material. The buffer layer MB may be deposited on the substrate SUB having the first pad AP, the routing line RT, the power line PL and the second pad CP. Therefore, the first pad AP, the routing line RT, the power line PL and the second pad CP are surrounded or sandwiched by the lower buffer layer BUF and the buffer layer MB. As the results, the metal material of the first pad AP, the routing line RT, the power line PL and the second pad CP can be prevented from being oxidized, which contribute to enhance the lifetime of the device.

As other elements are same as the embodiment referring to FIG. 3, the duplicated explanation is omitted.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. Further, these and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent lighting device, comprising:
a substrate including an emission area and a non-emission area adjacent to the emission area;
power lines disposed in the emission area and forming a plurality of open areas;
a buffer layer covering the power lines;
an emission element disposed in each of the open area on the buffer layer;
a link electrode overlapping the power lines on the buffer layer, and having a first end connected to the emission element and a second end connected to one of the power lines;
a passivation layer deposited within a width of the power line covering the link electrode;
an emission layer covering the emission area; and
a cathode layer covering the emission area on the emission layer.

2. The device according to claim 1, wherein the power lines are arranged in a mesh shape to form the open area therebetween; and
wherein the open area has a polygon shape and is separated from neighboring open area with a predetermined distance corresponding to the width of the power line.

3. The device according to the claim 1, wherein the emission element includes:
a first electrode larger than the open area;
the emission layer deposited on the first electrode; and
a second electrode formed by the open area among areas of the cathode layer.

4. The device according to claim 3, wherein the link electrode has a segment shape overlapping a middle portion of the power line;
wherein the first end is extended from the first electrode; and
wherein the second end is connected to the power line through a pixel contact hole penetrating the buffer layer.

5. The device according to claim 4, wherein the passivation layer covers whole of the link electrode and the pixel contact hole under the emission layer, and covers a circumference of the first electrode.

6. The device according to claim 5, wherein the passivation layer has a boundary disposed between the circumference of the first electrode and a circumference of the open area, and exposes the open area.

7. The device according to claim 1, further comprising:
a routing line connected to the power line, and disposed at the non-emission area as surrounding the emission area;
a first pad disposed at one side of the non-emission area and connected to the routing line; and
a second pad disposed at another side of the non-emission area and as being separated from the routing line, and having an end connected to the cathode layer.

8. The device according to claim 7, wherein the cathode layer is formed on the buffer layer covering the end of the second pad, and connected to the second pad through a pad contact hole exposing the end of the second pad.

9. The device according to claim 1, further comprising:
an encapsulation layer covering the emission area having the emission element;
a cover film disposed on the encapsulation layer; and
an adhesive attaching the encapsulation to the cover film.

10. The device according to claim 7, further comprising:
a light extracting layer on the substrate;
wherein the routing line and the power line is disposed on the light extracting layer.

11. The device according to claim 10, wherein the first pad, the second pad, the routing line, and the power line is made of a same metal material.

12. The device according to claim 11, wherein the metal material includes copper.

13. The device according to claim 7, further comprising:
a buffer layer on the light extracting layer;
wherein the routing line and the power line is disposed on the buffer layer.

* * * * *